United States Patent
Kim et al.

(10) Patent No.: US 7,580,314 B2
(45) Date of Patent: Aug. 25, 2009

(54) MEMORY DEVICE HAVING OPEN BIT LINE STRUCTURE AND METHOD OF SENSING DATA THEREFROM

(75) Inventors: Su-A Kim, Yongin-si (KR); Ki-Whan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 324 days.

(21) Appl. No.: 11/649,273

(22) Filed: Jan. 4, 2007

(65) Prior Publication Data

US 2007/0274122 A1    Nov. 29, 2007

(30) Foreign Application Priority Data

May 26, 2006    (KR) ............................ 2006-0047576

(51) Int. Cl.
    *G11C 8/00*  (2006.01)
(52) U.S. Cl. .............. 365/230.03; 365/149; 365/185.13
(58) Field of Classification Search ............ 365/230.03, 365/149, 185.13, 185.23, 185.27, 189.09, 365/207, 230.06
    See application file for complete search history.

(56) References Cited

U.S. PATENT DOCUMENTS

| 7,221,605 B2 * | 5/2007 | Forbes ........................ 365/205 |
| 2004/0228195 A1 * | 11/2004 | McElroy et al. ............. 365/222 |

FOREIGN PATENT DOCUMENTS

| JP | 09-0213069 | 8/1997 |
| JP | 2006-013536 | 1/2006 |
| KR | 10-0282693 | 11/2000 |
| KR | 10-0287546 | 1/2001 |
| KR | 10-2002-0036296 | 5/2002 |
| KR | 10-2005-0073092 | 7/2005 |

* cited by examiner

*Primary Examiner*—Dang T Nguyen
(74) *Attorney, Agent, or Firm*—Volentine & Whitt, PLLC

(57) ABSTRACT

A memory device includes a plurality of memory blocks. Each memory block includes a plurality of bit lines, a plurality of word lines, a plurality of memory cells provided at intersections of the bit lines and word lines; a plurality of capacitors, and a plurality of sense amplifiers. Each sense amplifier has a first input and a second input. The first input is connected to a first bit line of a first one of the memory blocks and is coupled via one of the capacitors to a first bit line of a second one of the memory blocks. The second input of the input is connected to a second bit line of the second one of the memory blocks and is coupled via one of the capacitors to a second bit line of the first one of the memory blocks.

22 Claims, 7 Drawing Sheets

MEMORY DEVICE HAVING OPEN BIT LINE STRUCTURE AND METHOD OF SENSING DATA THEREFROM

BACKGROUND AND SUMMARY

1. Field

This invention relates, in general, to semiconductor memory devices and, more particularly, to a memory device having an open bit line structure and a method of sensing data stored in such a memory device.

2. Description

In general, semiconductor memories can be classified into two different bit line structures: one is a folded bit line structure, and the other is an open bit line structure. In the folded bit line structure, a true bit line and a complementary bit-line are formed in parallel with each other on a same side of a sense amplifier as each other. In contrast, in the open bit-line structure, a true bit line and a complementary bit line are formed on opposite sides of a sense amplifier.

FIG. 6A shows a portion of an embodiment of a memory device having the folded bit line structure. FIG. 6B shows an embodiment of a memory device having the open bit line structure.

Of these two structures, the open bit line structure has been the focus of greater interest recently than the folded bit line structure, because the former permits a greater number of memory cells to be fit within a given unit area than the latter.

FIG. 1 shows in greater detail a memory device 100 having the open bit line structure. Memory device 100 includes: memory blocks 110 and 120; sense amplifiers 130-1~$n$; memory unit cells MC1~$n$1~$m$, each including an access transistor AT and a memory cell capacitor CC; bit lines BL1_$j$ through BLn_$j$ alternating and in parallel in memory block 110 and BL1_$i$ through BLn_i alternating and in parallel in memory block 120; and word lines WL1_$j$ through WLm_j and WL1_$i$ through WLm_i. Each of the memory blocks 110 and 120 includes n*m memory cells MC1~$n$1~$m$ located at intersections of word lines and bit lines, wherein n is the number of bit lines and m is the number of word lines. Although for illustration purposes FIG. 1 shows only two memory blocks 110 and 120, it is understood that memory device 100 may include many more memory blocks that are not shown in FIG. 1.

When a word line of memory block 110 is selected, then memory block 110 includes only true bit lines (sometimes denoted "BL1~$n$") and the memory block 120 has only complementary bit lines (sometimes denoted "/BL1~$n$"). On the other hand, When a word line of memory block 120 is selected, the memory block 110 has only complementary bit lines and the memory block 120 has only true bit lines. So the commonly used notation of "BL" and "/BL" can change according to which memory block is selected.

Each of sense amplifiers 130-1~$p$ has two inputs. One input is connected to a bit line BLk_j (e.g., an odd "true" bit line) in first memory block 110, and the other input is connected to a bit line BLp_i (e.g., an even "complementary" bit line) in the second memory block 120. For example, sense amplifier 130-1 has a first input connected to bit line BL1_$j$ in memory block 110, and a second input connected to bit line BL2_$i$ in memory block 120. Sense amplifiers 130-1~$n$ each sense and amplify a voltage difference between the voltages on the two bit lines connected to its two inputs.

As shown in FIG. 1, there exists a parasitic capacitance, (Cbl), between the lines of each adjacent bit line pair, BLk_j and BLk+1_j. Meanwhile, as the demand for higher integration and larger density increases, the distance between adjacent bit lines continues to become smaller. So the parasitic capacitance Cbl between the adjacent bit lines becomes a larger portion of the total bit line loading. In the folded bit line structure, the coupling effect of the parasitic capacitance Cbl can be cancelled by forming a bit line pair that crosses each other. However, in the open bit line structure, because a true bit line and a complementary bit line which are sensed by the sense amplifier are formed in different memory blocks, it is not easy to cancel the coupling effect caused by the parasitic capacitance Cbl.

To understand this better, FIG. 2 shows a structure of vertical memory cells MC1~$n$1~$m$ that may be employed in memory device 100 of the FIG. 1. Each of the vertical memory cells MC1~$n$1~$m$ includes a vertical channel transistor 210 as an access transistor AT, and a capacitor 220 as a memory cell capacitor CC. Capacitor 220 comprises storage node 222 and plate node 224. FIG. 2 shows access transistor 210 having a gate electrode connected to word line WL1-$j$, one of a drain and source electrode (e.g., drain electrode) connected to bit line BL1, and the other of drain and source electrode (e.g., source electrode) connected to storage node 222 of memory cell capacitor 220.

As shown in FIG. 2, the parasitic capacitance Cbl is created between adjacent bit lines, as described above. As the parasitic capacitance Cbl increases, one or more problems can develop with respect to the proper operation of the memory device 100. One such problem will be explained now with respect to FIGS. 4A and 4B.

Assume that in FIGS. 1 and 2 MC11 stores data corresponding to a digital value "0," and MC21 stores data corresponding to a digital value "1." When it is time to read the data, all of the bit lines are pre-charged to a voltage level of VCC/2. Then, a word line (e.g., WL1_$j$) is activated to turn on the access transistors 210 connected to the activated word line. At this point, a charge-sharing operation occurs, e.g., between bit line BL1_$j$ and the charge stored on the memory cell capacitor CC of MC11 (data=0), and between BL2_$j$ and the charge stored on the memory cell capacitor CC of MC21 (data=1), etc. As a result of the charge sharing operation, the voltage on BL1_$j$ drops below VCC/2, while the voltage on BL2_$j$ rises above VCC/2, etc. Accordingly, a voltage difference, $\Delta$Vbk, is created between the voltage on each odd "true" bit line of memory block 110 and the voltage on the corresponding even "complementary" bit line of memory block 120 for each bit line pair. For example, $\Delta$Vb1 is the difference between the voltage of BL1~$j$ (true bit line "BL1") after the charge sharing operation and the voltage VCC/2 pre-charged onto the reference bit line BL2_$i$ (complementary bit line "/BL1"). This voltage $\Delta$Vbk is then sensed and amplified by the corresponding sense amplifier 130 to read the data stored in the corresponding memory cell, MCk1.

FIG. 5A shows the bit line voltage waveforms for the case of an exemplary memory device 100 during the charge sharing and amplifying operation, as described above, in a case where the parasitic capacitance Cbl between adjacent bit lines is assumed to be negligible. In the example of FIG. 5A, it is assumed that: 256 vertical channel access transistors AT of memory cells MCk1 are connected to one bit line, BL1_$j$, and the total capacitance loading and resistance of the bit line is 34 fF and 50 k$\Omega$ respectively. The capacitance of a memory cell capacitor CC is 10 fF.

In the case of FIG. 5A, as explained above, when word line WL1_$j$ is activated then bit line BL1_$j$ is pulled down by the charge-sharing operation between BL1_$j$ and the charge stored on memory cell capacitor CC of MC11 (data=0), so that a voltage $\Delta$Vb1 is developed between BL1_$j$ and BL2_$i$ (i.e., /BL1_ which is sufficient for sense amplifier 130-1 to sense a "0" stored in MC11, and amplify the voltage ΔVb1 to produce a correct output.

Thus, memory device 100 operates properly when there is very little or no parasitic capacitance Cbl between adjacent bit lines.

However, now consider the case where there is significant parasitic capacitance Cbl between adjacent bit lines, e.g., between bit line BL1_j and adjacent bit line BL2_j. FIG. 5B shows the bit line voltage waveforms for the case of an exemplary memory device 100 during the charge sharing and amplifying operation, as described above, where there is a significant coupling capacitance Cbl between adjacent bit lines. In the example of FIG. 5B, it is assumed that: 256 vertical channel access transistors AT of memory cells MCk1 are connected to one bit line, BL1_j, and the total capacitance loading and resistance of the bit line is 34 fF and 50 kΩ respectively. The capacitance of a memory cell capacitor CC is 10 fF. Meanwhile, in the example of FIG. 5B it is assumed that parasitic capacitance Cbl is 10 fF, or about 30% of the total bit line capacitance.

In this case, when word line WL1_j is activated then bit line BL1_j is pulled down by the charge-sharing operation between BL1_j and the charge stored on memory cell capacitor CC of MC11 (data=0). However, due to the coupling effect of parasitic capacitor Cbl between BL1_j and BL2_j, the charge stored on memory cell capacitor CC of MC21 (data=1) is also coupled, through Cbl, to bit line BL1_j. As a result, the voltage ΔVbl between BL1_j and BL2_i (i.e., /BL1) is smaller than the threshold sensing voltage of the sense amplifier 130-1 (e.g., an offset voltage of an input stage of sense amplifier 130-1). Thus, sense amplifier 130-1 amplifies the voltages of BL1_j and BL2_i to Vcc and the Vss, respectively. That is, a "1" is incorrectly sensed as being stored in memory cell MC11, instead of the correct value of "0." Therefore, the bit line data sensing operation fails.

Accordingly, it would be advantageous to provide a memory device having an open bit line structure that can accurately sense data despite the existence of significant coupling capacitance between adjacent bit lines. It would also be advantageous to provide a method of sensing data stored in such a memory device. Other and further objects and advantages will appear hereinafter.

The present invention comprises a memory device having an open bit line structure and a method of sensing data stored in such a memory device.

In one aspect of the invention, a memory device comprises: a plurality of memory blocks each comprising a set of n bit lines and a set of m word lines and a plurality of memory cells provided at intersections of the bit lines and the word lines; a plurality of sense amplifiers, each sense amplifier having a first input connected to a $k^{th}$ bit line of a first memory block and a second input connected to an $p^{th}$ bit line of a second memory block; and a plurality of decoupling capacitors, wherein one of the decoupling capacitors is connected between the first input of one of the sense amplifiers and a bit line of the second memory block adjacent to the $p^{th}$ bit line, and a second one of the decoupling capacitors is connected between the second input of the one sense amplifier and a bit line of the first memory block adjacent to the $k^{th}$ bit line.

In another aspect of the invention, a memory device has a plurality of memory blocks, a plurality of sense amplifiers, and a plurality of decoupling capacitors, each memory block including a plurality of memory cells connected to word lines and bit lines, wherein each bit line is connected to an input of a first one of the sense amplifiers and is coupled through one of the decoupling capacitors to an input of a second one of the sense amplifiers.

In a further aspect of the invention, a memory device comprises: a plurality of memory blocks, each memory block comprising, a plurality of bit lines, a plurality of word lines, and a plurality of memory cells provided at intersections of the bit lines and word lines; a plurality of decoupling capacitors; and a plurality of sense amplifiers, each sense amplifier having a first input and a second input, the first input being connected to a first bit line of a first one of the memory blocks and being coupled via one of the decoupling capacitors to a first bit line of a second one of the memory blocks, and the second input being connected to a second bit line of the second one of the memory blocks and being coupled via another one of the decoupling capacitors to a second bit line of the first one of the memory blocks In yet another aspect of the invention, a method is provided for sensing bit-line data in a memory device comprising a plurality of memory blocks. The method comprises: activating a word line of a first memory block; receiving a first voltage at a first input of a sense amplifier connected to a first bit line of the first memory block; receiving a second voltage at a second input of the sense amplifier connected to a bit line of a second memory block and capacitively coupled to a second bit line of the first memory block, wherein the first bit line of the first memory block is adjacent to the second bit line of the first memory block; and sensing a data value stored in the memory cell connected to the activated word line and the first bit line of the first memory block based on a difference between the received first voltage and the received second voltage.

In still another aspect of the invention, a method is provided for sensing bit-line data in a memory device comprising a plurality of memory blocks. The method comprises: providing a precharge voltage on a first bit line of a first memory block and a bit line of a second memory block; activating a word line of the first memory block; transferring to the first bit line of the first memory block a data voltage stored in a storage capacitor of a memory cell connected to the activated word line and the first bit line; coupling a coupling voltage from a second bit line of the first memory block to the first bit line of first memory block; receiving a first voltage, comprising a sum of the precharge voltage, the data voltage, and the coupling voltage, at a first input of a sense amplifier connected to the first bit line of the first memory block; capacitively coupling the coupling voltage from the second bit line of the first memory block to the bit line of the second memory block; receiving a second voltage, comprising a sum of the precharge voltage and the coupling voltage, at a second input of the sense amplifier voltage connected to the bit line of the second memory block; and sensing a data value stored in the memory cell connected to the activated word line and the first bit line of the first memory block based on a difference between the first voltage and the second voltage.

DETAILED DESCRIPTION

Figure 2:
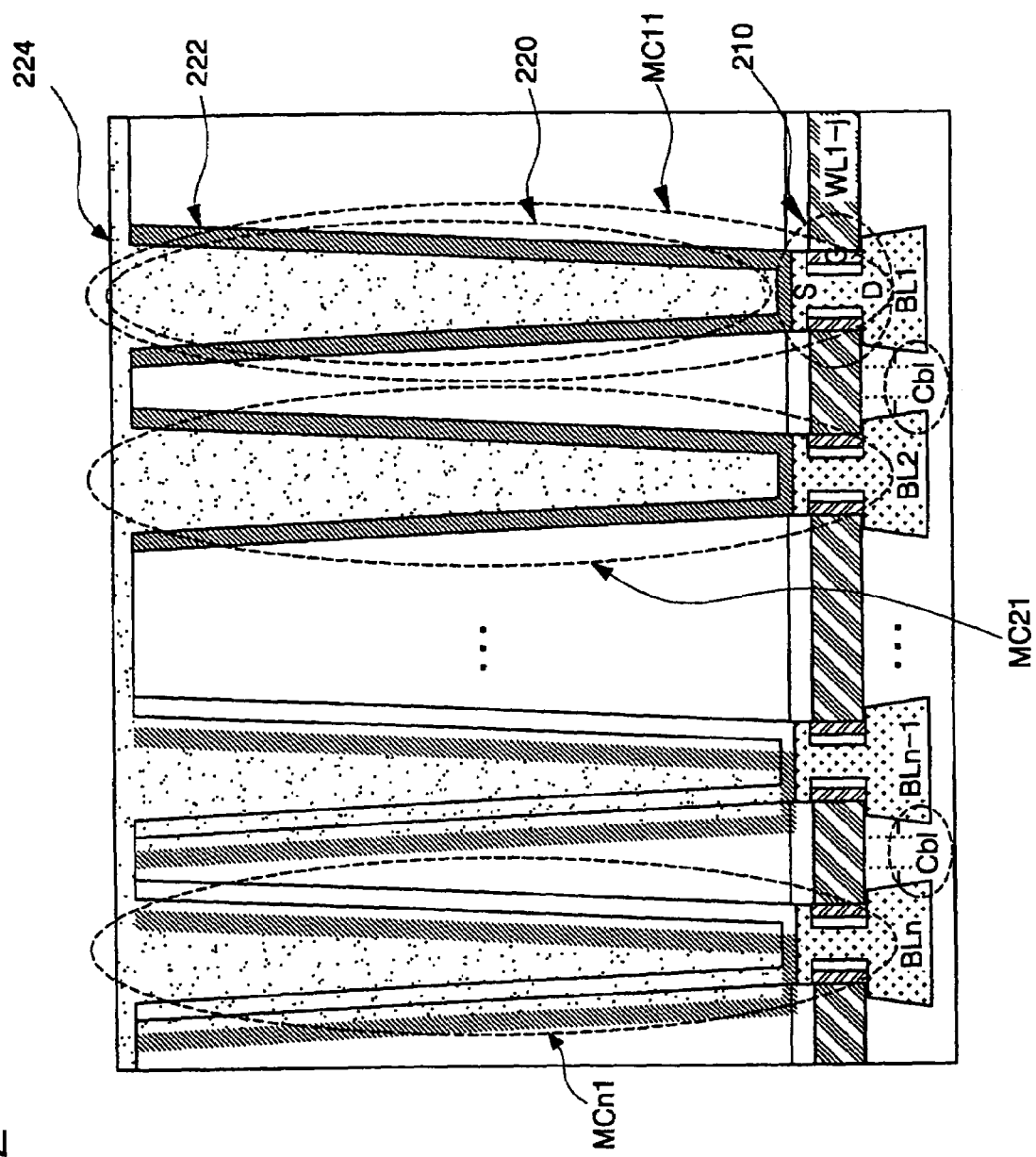
FIG. 2 shows a structure of vertical memory cells that may be employed in a memory device.
Figure 3:
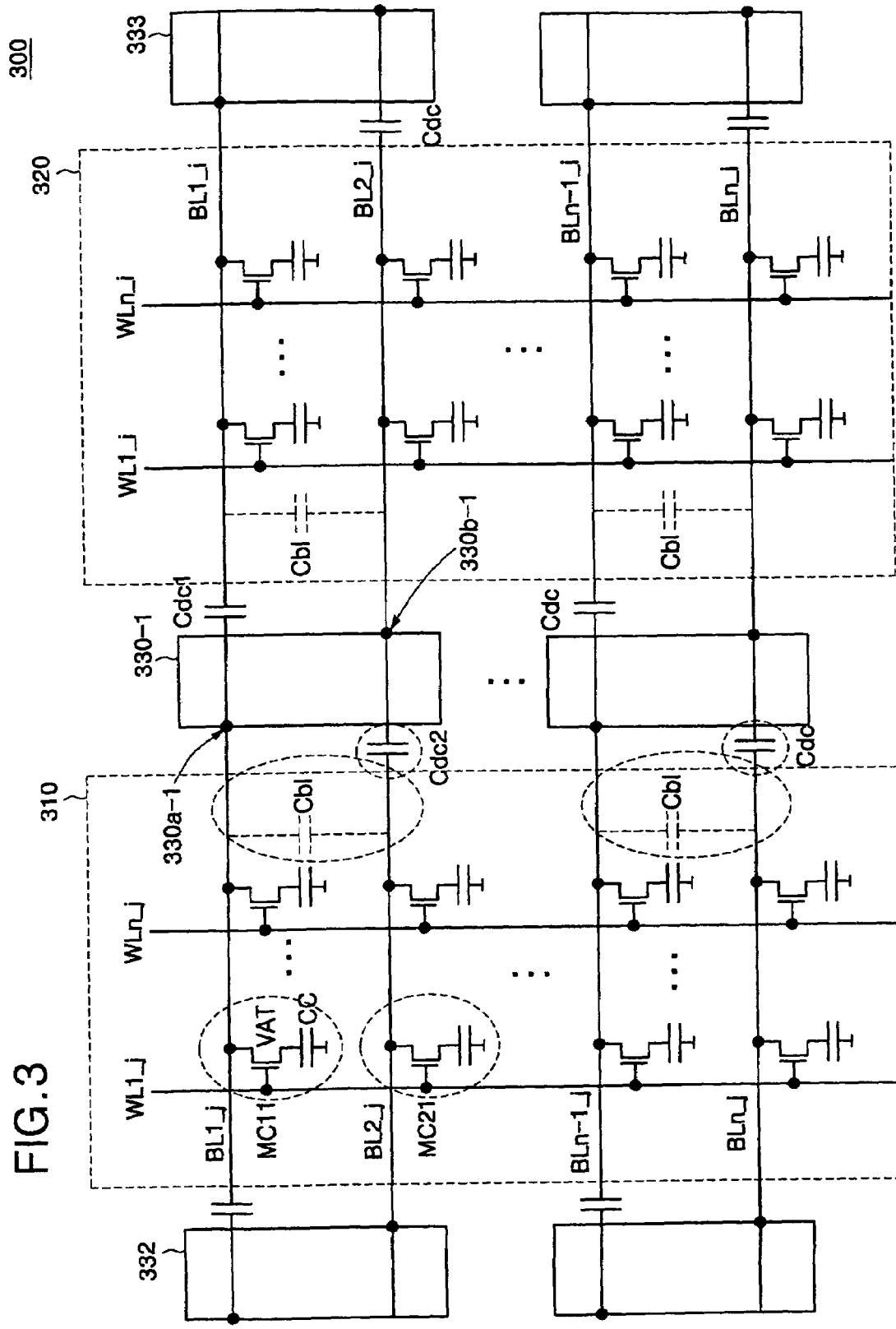
FIG. 3 shows one embodiment of a memory device having an open bit-line structure including means for counteracting an effect of a coupling capacitance between adjacent bit lines.

FIG. 3 shows one embodiment of a memory device 300 having an open bit-line structure including means for counteracting or mitigating an effect of a parasitic coupling capacitance between adjacent bit lines. Memory device 300 includes: memory cell blocks 310 and 320; sense amplifiers 330-1~n; memory unit cells MC1~n1~m, each including an access transistor AT and a memory cell capacitor CC; bit lines BL1_j through BLn_j alternating and in parallel in memory block 310 and BL1_i through BLn_i alternating and in parallel in memory block 320; and word lines WL1_j through WLm_j and WL1_i through WLm_i. Each of the memory blocks includes n*m memory cells MC1~n1~m located at intersections of word lines and bit lines, wherein n is the number of bit lines and m is the number of word lines. Beneficially, the memory cells MC1~n1~m each have a vertical channel transistor as access transistor AT, for example the transistor 210 shown in FIG. 2. Although for illustration purposes FIG. 3 shows only two memory blocks 310 and 320, it is understood that memory device 300 may include many more memory blocks that are not shown in FIG. 3.

When a word line of memory block 310 is selected, then memory block 310 includes only true bit lines (sometimes denoted "BL1~n") and the memory block 320 has only complementary bit lines (sometimes denoted "/BL1~n"). On the other hand, When a word line of memory block 320 is selected, the memory block 310 has only complementary bit lines and the memory block 320 has only true bit lines. So the commonly used notation of "BL" and "/BL" can change according to which memory block is selected.

Each of sense amplifiers 330-1~n has two inputs, 330a-1~n, and 330b-1~n. Inputs 330a-1~n each are connected to a bit line BLk_j (e.g., an odd "true" bit line) in first memory block 310, and inputs 330b-1~n each are connected to a bit line BLp_i (e.g., an even "complementary" bit line) in second memory block 320, where |k−p|=1. For example, sense amplifier 330-1 has a first input 330a-1 connected to bit line BL1_j in memory block 310, and a second input 330b-1 connected to bit line BL2_i in memory block 320. Sense amplifiers 330-1~n each sense and amplify a voltage difference between the voltages on the two bit lines connected to its two inputs.

Figure 1:
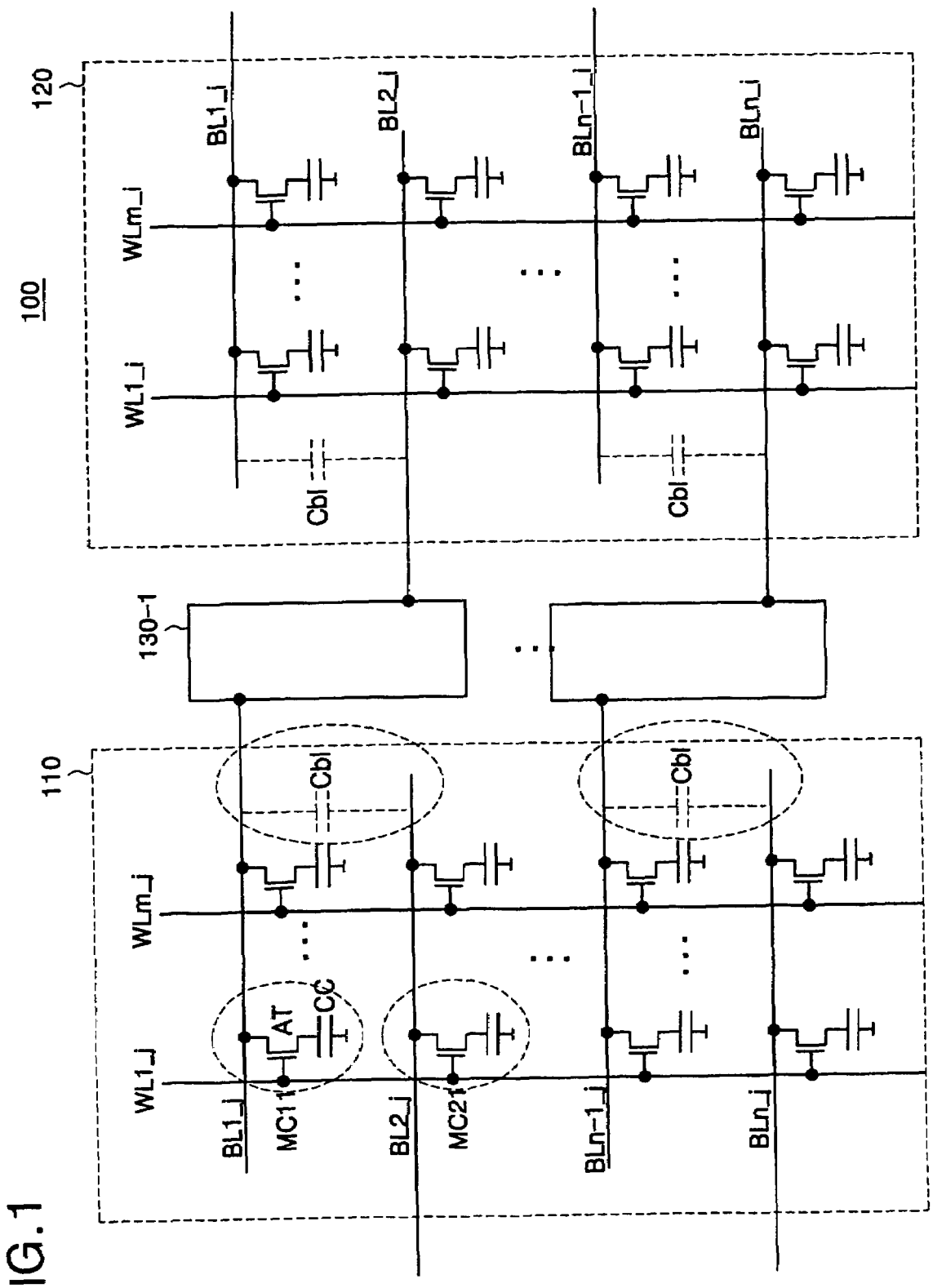
FIG. 1 shows a memory device having an open bit line structure.

Comparing memory device 300 of FIG. 3 with memory device 100 of FIG. 1, the memory device 300 includes decoupling capacitors (Cdc) that are not present in memory device 100. For example, a first decoupling capacitor Cdc1 is connected between BL1_j in a memory block 310 (also connected to input 330a-1 of sense amplifier 330-1), and BL1_i in a memory block 320, and a second decoupling capacitor Cdc2 is connected between BL2_j in the memory block 310 and BL2_i in the memory block 320 (also connected to input 330b-1 of sense amplifier 330-1).

A method of sensing data from memory device 300 now will be explained with respect to FIGS. 3 and 5C.

Assume that in FIG. 3, MC11 stores data corresponding to a digital value "0," and MC21 stores data corresponding to a digital value "1." When it is time to read the data, all of the bit lines are pre-charged to a voltage level of VCC/2. Then, a word line (e.g., WL1_j) is activated to turn on the access transistors AT (e.g., access transistor 210 of FIG. 2) connected to the activated word line. At this point, a charge-sharing operation occurs, e.g., between BL1_j and the charge stored on memory cell capacitor CC of MC11 (data=0), and between BL2_j and the charge stored on memory cell capacitor CC of MC21 (data=1), etc. As a result of the charge sharing operation, the voltage on BL1_j drops below VCC/2, while the voltage on BL2_j rises above VCC/2, etc. Accordingly, a voltage difference, ΔVbk, is created between the voltage on each odd "true" bit line BLk_j of memory block 310 and the voltage on the corresponding even "complementary" bit line BLp_j of memory block 320 for each bit line pair, wherein |k−p|=1. For example, ΔVb1 is the difference between the voltage of BL1_j ("BL1") after the charge sharing operation and the voltage VCC/2 pre-charged onto the reference bit line BL2_i ("/BL1"). This voltage ΔVbk is then sensed and amplified by the corresponding sense amplifier 130 to read the data stored in the corresponding memory cell, MCk1.

However, at this time, due to the coupling effect of parasitic capacitor Cbl between BL1_j and BL2_j, the charge stored on memory cell capacitor CC of MC21 (data=1) is also coupled, through Cbl, to bit line BL1_j, etc. As a result, the voltage ΔVbl between BL1_j (e.g., "BL1") and BL2_i (e.g., "/BL1") is reduced.

Advantageously, however, decoupling capacitor Cdc2 provided between BL2_j in the memory block 310 and BL2_i in the memory block 320 causes the voltage on bit line BL2_i to increase at the same time to thereby counteract or mitigate the effect of parasitic capacitance Cbl on the voltage on bit line BL1_j. Accordingly, ΔVbl between the two inputs 330a-1 and 330b-1 connected to sense amplifier 330-1 in memory device 300 is increased by the coupling effect of decoupling capacitor Cdc2.

Figure 5A:
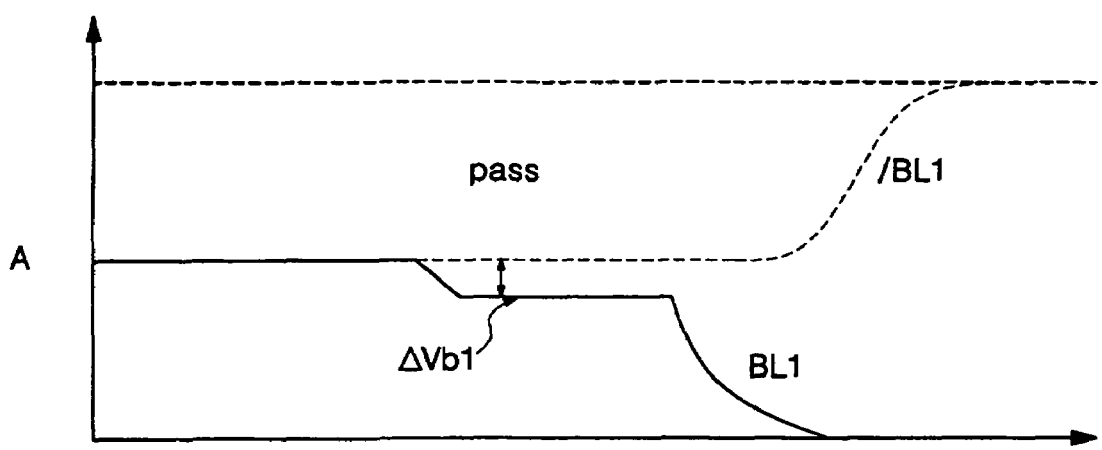
FIG. 5A shows bit line voltage waveforms for the memory device of FIG. 1 during a charge sharing operation in a case where the parasitic capacitance between adjacent bit lines is assumed to be negligible.
Figure 5B:
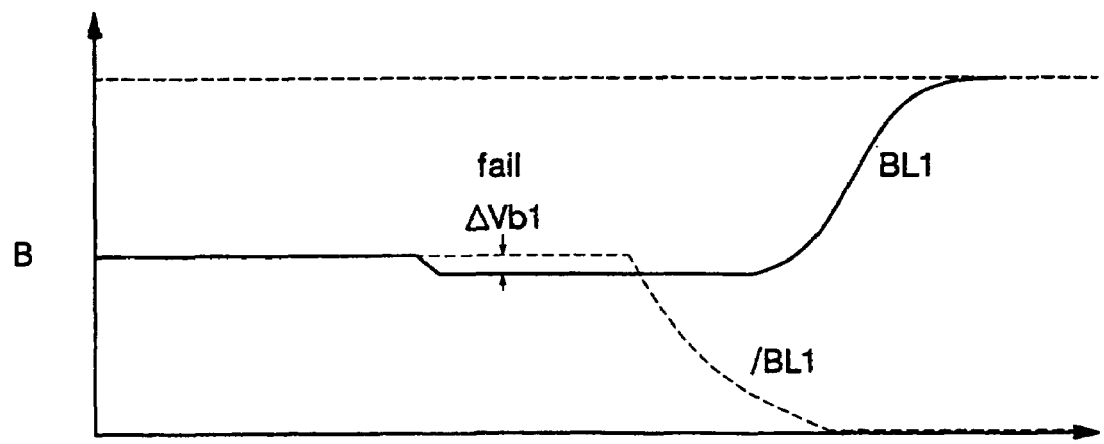
FIG. 5B shows bit line voltage waveforms for the memory device of FIG. 1 during a charge sharing operation in a case where the parasitic capacitance between adjacent bit lines is significant.
Figure 5C:
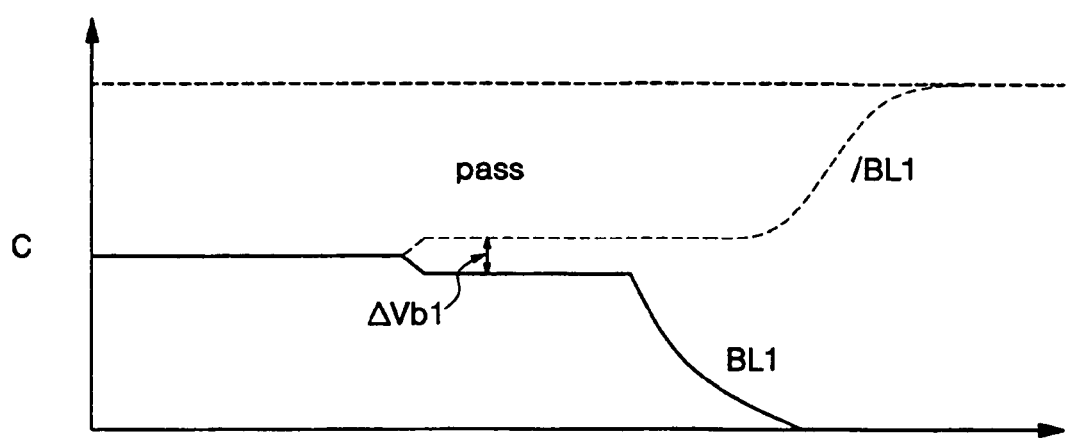
FIG. 5C shows bit line voltage waveforms for the memory device of FIG. 3 during a charge sharing operation in a case where the parasitic capacitance between adjacent bit lines is significant.
Figure 6A:
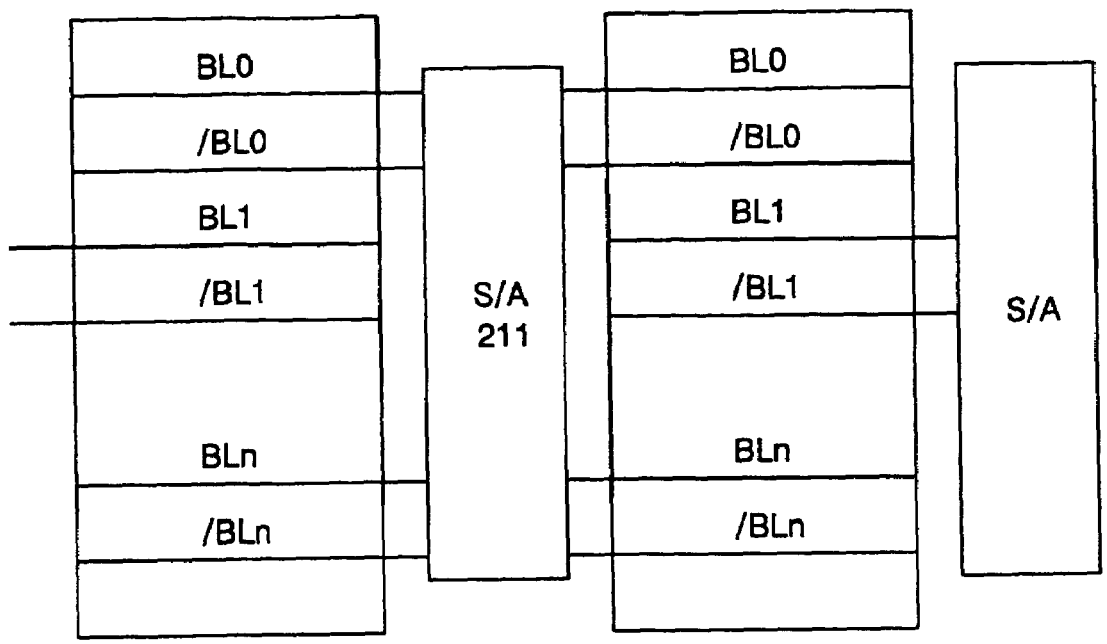
FIG. 6A shows a portion of an embodiment of a memory device having a folded bit line structure.
Figure 6B:
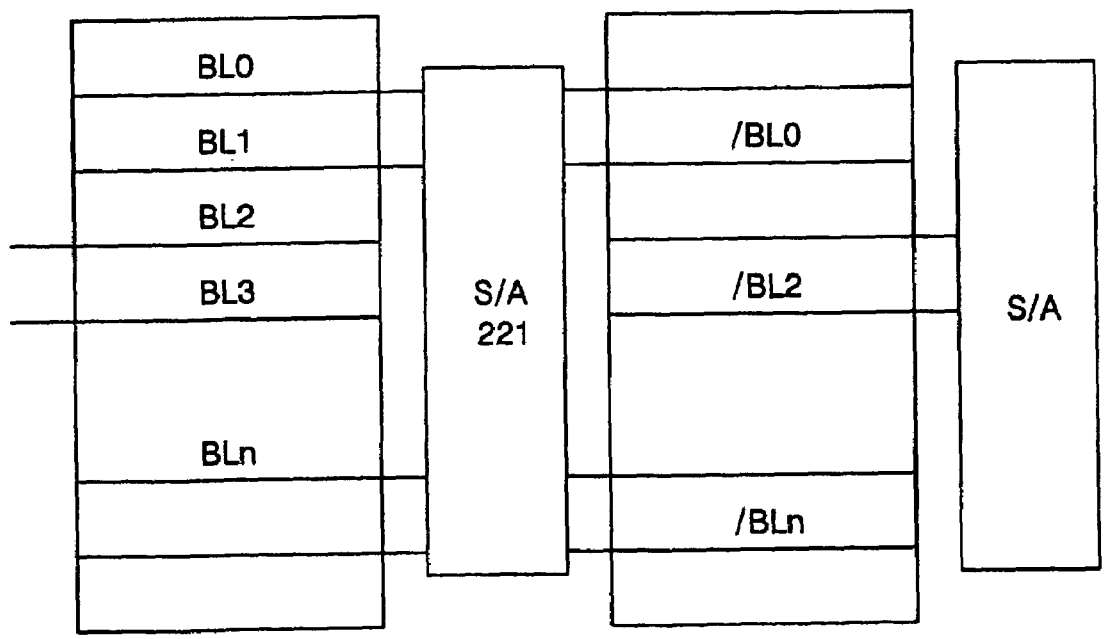
FIG. 6B shows a portion of an embodiment of a memory device having an open bit line structure.

FIG. 5C shows the bit line voltage waveforms for the case of memory device 300 during the charge sharing operation, as described above, where there is a significant coupling capacitance, Cbl, between adjacent bit lines. In the example of FIG. 5C, it is assumed that: 256 vertical channel access transistors AT (e.g., access transistors 210 of FIG. 2) of memory cells MCk1 are connected to one bit line, BL1, and the total capacitance loading and resistance of the bit line is 34 fF and 50 kΩ respectively. The capacitance of a memory cell capacitor CC is 10 fF. In this example it is assumed that the parasitic capacitance Cbl is 10 fF, about 30% of the total bit line capacitance. Furthermore, the capacitance of the decoupling capacitors, Cdc, is also selected to be 10 fF to offset the effects of the parasitic capacitance Cbl between adjacent bit lines.

In the case of FIG. 5C, when word line WL1_j is activated, then bit line BL1_j is pulled down by the charge-sharing operation between BL1_j and the charge stored on memory cell capacitor CC of MC11 (data=0). However, due to the coupling effect of parasitic capacitance Cbl between BL1_j and BL2_j, the charge stored on memory cell capacitor CC of MC21 (data=1) is also coupled, through Cbl, to bit line BL1_j. As a result, the voltage on bit line BL1_j is not pulled down as low as quickly as it would be if the parasitic capacitance Cbl did not exist or was negligible.

However, advantageously, in the memory device 300 the decoupling capacitor Cdc2 also couples the charge on stored on memory cell capacitor CC of MC21 (data=1) to the reference bit line BL2_i (complementary bit line "/BL1") of memory block 320 to thereby raise the voltage level thereof above the voltage VCC/2. Accordingly, ΔVbl between the two inputs 330a-1 and 330b-1 connected to sense amplifier 330-1 in memory device 300 is increased by the coupling effect of decoupling capacitor Cdc2 to exceed the threshold sensing voltage of sense amplifier 330-1 (e.g., an offset voltage of an input stage of sense amplifier 330-1).

Thus, sense amplifier 330-1 correctly amplifies the voltages of BLk_j ("BL1") and BLp_j ("/BL1") to Vss and the Vcc, respectively. That is, a "0" is correctly sensed as being stored in memory cell MC11. Therefore, the bit line data sensing operation succeeds.

In the example above, beneficially the decoupling capacitors Cdc each have values that are approximately the same as the values of the parasitic capacitance, Cbl, between adjacent bit lines. However, other convenient values may be selected to accomplish the objective of counteracting or mitigating the effects of parasitic capacitance Cbl.

Figure 4:
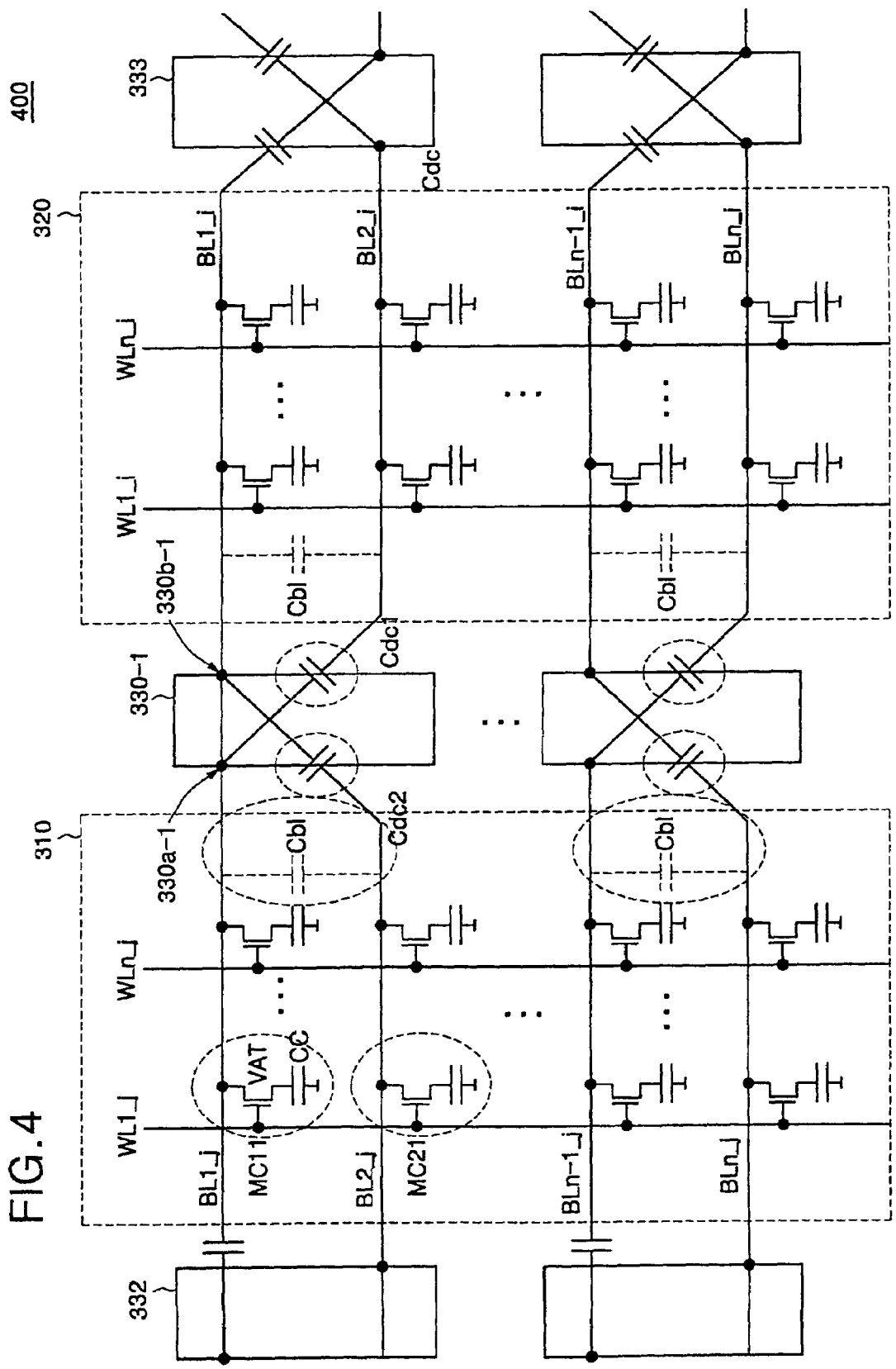
FIG. 4 shows another embodiment of a memory device having an open bit-line structure including means for counteracting an effect of a coupling capacitance between adjacent bit lines.

FIG. 4 shows another embodiment of a memory device 400 having an open bit-line structure including means for counteracting or mitigating an effect of a parasitic coupling capacitance between adjacent bit lines.

Memory device 400 has a similar construction and operation to that of memory device 300, and so only the differences between memory device 400 and memory device 300 will be explained.

In memory device 400, inputs 330a-1~n of sense amplifiers 330-1~n each are connected to a bit line BLk_j (e.g., an odd "true" bit line) in first memory block 310, and inputs 330b-1~n each are connected to a bit line BLk_i (e.g., an odd "complementary" bit line) in second memory block 320. For example, sense amplifier 330-1 has a first input 330a-1 connected to bit line BL1_j in memory block 310, and a second input 330b-1 connected to bit line BL1_i in memory block 320.

Meanwhile, first decoupling capacitor Cdc1 is connected between BL1_j in a memory block 310 (also connected to input 330a-1 of sense amplifier 330-1), and BL2_i in a memory block 320, and a second decoupling capacitor Cdc2 is connected between BL2_j in the memory block 310 and BL1_i in the memory block 320 (also connected to input 330b-1 of sense amplifier 330-1).

Sense amplifiers 330-1~n each sense a voltage difference, ΔVbk, created between the voltage on an odd "true" bit line BLk_j of memory block 310 and the voltage on a corresponding odd "complementary" bit line BLk_i of memory block 320 after a word line has been activated causing a charge sharing operation. For example, ΔVb1 is the difference between the voltage of BL1_j ("BL1") after the charge sharing operation, and the voltage VCC/2 pre-charged onto the reference bit line BL1_i ("/BL1"). This voltage ΔVbk is then sensed and amplified by the corresponding sense amplifier 130 to read the data stored in the corresponding memory cell, MCk1.

However, as before, due to the coupling effect of parasitic capacitor Cbl between BL1_j and BL2_j, the charge stored on memory cell capacitor CC of MC21 (data=1) is also coupled, through Cbl, to bit line BL1_j, etc. As a result, the voltage ΔVbl between BL1_j (e.g., "BL1") and BL2_i (e.g., "/BL1") is reduced.

Advantageously, however, decoupling capacitor Cdc2 provided between BL2_j in the memory block 310 and BL1_i in the memory block 320 causes the voltage on bit line BL1_i to increase at the same time to thereby counteract or mitigate the effect of parasitic capacitance Cbl on the voltage on bit line BL1_j. Accordingly, ΔVbl between the two inputs 330a-1 and 330b-1 connected to sense amplifier 330-1 in memory device 300 is increased by the coupling effect of decoupling capacitor Cdc2. Therefore, the bit line data sensing operation succeeds. An exemplary result is illustrated in FIG. 5C as explained above.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the scope of the appended claims.

We claim:

1. A memory device, comprising:
   a plurality of memory blocks each comprising a set of n bit lines and a set of m word lines and a plurality of memory cells provided at intersections of the bit lines and the word lines;
   a plurality of sense amplifiers, each sense amplifier having a first input connected to a $k^{th}$ bit line of a first memory block and a second input connected to an $p^{th}$ bit line of a second memory block; and
   a plurality of decoupling capacitors,
   wherein one of the decoupling capacitors is connected between the first input of one of the sense amplifiers and a bit line of the second memory block adjacent to the $p^{th}$ bit line, and a second one of the decoupling capacitors is connected between the second input of the one sense amplifier and a bit line of the first memory block adjacent to the $k^{th}$ bit line.

2. The memory device of claim 1, wherein k=p.

3. The memory device of claim 1, wherein |k−p|=1.

4. The memory device of claim 1, wherein each decoupling capacitor has a value approximately the same as a parasitic coupling capacitance between adjacent bit lines in a memory block.

5. The memory device of claim 4, wherein each memory cell comprises:
   a storage capacitor; and
   a vertical transistor having a first terminal connected to the storage capacitor, a second terminal connected to one of the bit lines, and a control terminal connected to one of the word lines.

6. The memory device of claim 1, wherein each memory cell comprises:
   a storage capacitor; and
   a vertical transistor having a first terminal connected to the storage capacitor, a second terminal connected to one of the bit lines, and a control terminal connected to one of the word lines.

7. A memory device comprising:
   a first memory block including a first memory cell connected between a first word line and a first bit line, and a second memory cell connected between the first word line and a second bit line;
   a second memory block including a third memory cell connected between a second word line and a first inverted bit line, and a fourth memory cell connected between the second word line and a second inverted bit line;
a sense amplifier having a first input connected to the first bit line of the first memory block and the second inverted bit line of the second memory block, and a second input connected to the second bit line of the first memory block and the first inverted bit line of the second memory block;
a first decoupling capacitor connected between the first bit line and the first input of the sense amplifier;
a second decoupling capacitor connected between the second bit line and the second input of the sense amplifier;
a third decoupling capacitor connected between the second bit line and the second input of the sense amplifier; and
a fourth decoupling capacitor connected between the first inverted bit line and the second input of the sense amplifier.

8. The memory device of claim 7, wherein each decoupling capacitor has a value approximately the same as a parasitic coupling capacitance between adjacent bit lines, wherein the first bit line is adjacent to the second bit line, and the first inverted bit line is adjacent to the second inverted bit line.

9. The memory device of claim 8, wherein each memory cell comprises:
a storage capacitor; and
a vertical transistor having a first terminal connected to the storage capacitor, a second terminal connected to one of the first bit line, the second bit line, the third bit line and the fourth bit line, and a control terminal connected to one of the first word line and the second word line.

10. The memory device of claim 7, wherein each memory cell comprises:
a storage capacitor; and
a vertical transistor having a first terminal connected to the storage capacitor, a second terminal connected to one of the first bit line, the second bit line, the third bit line and the fourth bit line, and a control terminal connected to one of the first word line and the second word line.

11. A memory device, comprising:
a plurality of memory blocks, each memory block comprising,
a plurality of bit lines,
a plurality of word lines, and
a plurality of memory cells provided at intersections of the bit lines and word lines;
a plurality of decoupling capacitors; and
a plurality of sense amplifiers, each sense amplifier having a first input and a second input, the first input being connected to a first bit line of a first one of the memory blocks and being coupled via one of the decoupling capacitors to a first bit line of a second one of the memory blocks, and the second input being connected to a second bit line of the second one of the memory blocks and being coupled via another one of the decoupling capacitors to a second bit line of the first one of the memory blocks.

12. The memory device of claim 11, wherein the first and second bit lines of the first memory block are disposed adjacent each other.

13. The memory device of claim 12 wherein the decoupling capacitor coupling the second bit line of the first memory block to the second input of the sense amplifier has a value approximately the same as a parasitic coupling capacitance between the first and second bit lines of the first memory block.

14. The memory device of claim 13, wherein the first and second bit lines of the second memory block are disposed adjacent each other.

15. The memory device of claim 14, wherein the decoupling capacitor coupling the first bit line of the second memory block to the first input of the sense amplifier has a value approximately the same as a parasitic coupling capacitance between the first and second bit lines of the second memory block.

16. The memory device of claim 12, wherein the first and second bit lines of the second memory block are disposed adjacent each other.

17. The memory device of claim 16, wherein the decoupling capacitor coupling the first bit line of the second memory block to the first input of the sense amplifier has a value approximately the same as a parasitic coupling capacitance between the first and second bit lines of the second memory block.

18. The memory device of claim 11, wherein each memory cell comprises:
a storage capacitor; and
a vertical transistor having a first terminal connected to the storage capacitor, a second terminal connected to one of the bit lines, and a control terminal, connected to one of the word lines.

19. A method of sensing bit-line data in a memory device comprising a first memory block including a first memory cell connected between a first word line and a first bit line, and a second memory cell connected between the first word line and a second bit line; a second memory block including a third memory cell connected between a second word line and a first inverted bit line, and a fourth memory cell connected between the second word line and a second inverted bit line; a sense amplifier having a first input connected to the first bit line of the first memory block and the second inverted bit line of the second memory block, and a second input connected to the second bit line of the first memory block and the first inverted bit line of the second memory block; a first decoupling capacitor connected between the first bit line and the first input of the sense amplifier; a second decoupling capacitor connected between the second bit line and the second input of the sense amplifier; a third decoupling capacitor connected between the second inverted bit line and the first input of the sense amplifier; and a fourth decoupling capacitor connected between the first inverted bit line and the second input of the sense amplifier, the method comprising:
activating the first word line;
receiving a first voltage at the first input of the sense amplifier and a second voltage at the second input of the sense amplifier and capacitively coupling the first bit line and the second bit line and decoupling by the second decoupling capacitor the second bit line and the first inverted bit line, wherein the first bit line of the first memory block is adjacent to the second bit line of the first memory block; and
sensing a data value stored in the first memory cell based on a voltage difference between the first bit line and the first inverted bit line.

20. The method of claim 19, wherein the second input of the sense amplifier is capacitively coupled to the second bit line of the first memory block by the second decoupling capacitor having a value approximately the same as a parasitic coupling capacitance between the first and second bit lines of the first memory block.

21. A method of sensing bit-line data in a memory device comprising a first memory block including a first memory cell connected between a first word line and a first bit line, and a second memory cell connected between the first word line and a second bit line; a second memory block including a third memory cell connected between a second word line and a first inverted bit line, and a fourth memory cell connected between the second word line and a second inverted bit line; a sense amplifier having a first input connected to the first bit line of the first memory block and the second inverted bit line of the second memory block, and a second input connected to the second bit line of the first memory block and the first inverted bit line of the second memory block; a first decoupling capacitor connected between the first bit line and the first input of the sense amplifier; a second decoupling capacitor connected between the second bit line and the second input of the sense amplifier; a third decoupling capacitor connected between the second inverted bit line and the first input of the sense amplifier; and a fourth decoupling capacitor connected between the first inverted bit line and the second input of the sense amplifier, the method comprising:

providing a precharge voltage on the first bit line and the second bit line of the first memory block and the first inverted bit line and the second inverted bit line of the second memory block;

activating the first word line of the first memory block;

transferring to the first bit line a first data voltage stored in the first memory cell and to the second bit line a second data voltage stored in the second memory cell;

capacitively coupling the second bit line and the first bit line and decoupling by the second decoupling capacitor the first bit line and the first inverted bit line, wherein the first bit line of the first memory block is adjacent to the second bit line of the first memory block; and sensing a data value stored in the first memory cell based on a difference between the first bit line and the first inverted bit line.

22. The method of claim 21, wherein the second decoupling capacitor has a capacitance of a value approximately the same as a parasitic coupling capacitance between the first bit line and second bit line.

* * * * *